United States Patent
Li

(10) Patent No.: US 10,446,790 B2
(45) Date of Patent: Oct. 15, 2019

(54) OLED ENCAPSULATING STRUCTURE AND MANUFACTURING METHOD THEREOF

(71) Applicant: SHENZHEN CHINA STAR OPTOELECTRONICS SEMICONDUCTOR DISPLAY TECHNOLOGY CO., LTD., Shenzhen, Guangdong (CN)

(72) Inventor: Wenjie Li, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 15/741,909

(22) PCT Filed: Nov. 30, 2017

(86) PCT No.: PCT/CN2017/113695
§ 371 (c)(1),
(2) Date: Jan. 4, 2018

(87) PCT Pub. No.: WO2019/085115
PCT Pub. Date: May 9, 2019

(65) Prior Publication Data
US 2019/0131567 A1    May 2, 2019

(30) Foreign Application Priority Data
Nov. 1, 2017    (CN) .......................... 2017 1 1060227

(51) Int. Cl.
*H01L 51/52*    (2006.01)
*H01L 51/56*    (2006.01)
*H01L 27/32*    (2006.01)

(52) U.S. Cl.
CPC .......... *H01L 51/5253* (2013.01); *H01L 51/56* (2013.01); *H01L 27/3244* (2013.01); *H01L 51/524* (2013.01)

(58) Field of Classification Search
CPC . H01L 51/5253; H01L 27/3244; H01L 51/56; H01L 51/5237; H01L 51/524
See application file for complete search history.

(56) References Cited

U.S. PATENT DOCUMENTS

| | | | | |
|---|---|---|---|---|
| 8,955,996 B2* | 2/2015 | Ooya | .................. | C09K 11/663 362/84 |
| 2011/0006334 A1* | 1/2011 | Ishii | ..................... | C09K 11/584 257/98 |
| 2011/0127498 A1 | 6/2011 | Jung et al. | | |

FOREIGN PATENT DOCUMENTS

| | | |
|---|---|---|
| CN | 102450097 A | 5/2012 |
| CN | 104538557 | 4/2015 |

(Continued)

*Primary Examiner* — Quoc D Hoang
(74) *Attorney, Agent, or Firm* — Hemisphere Law, PLLC; Zhigang Ma

(57) ABSTRACT

The present application provides an encapsulation method for an OLED and an encapsulation structure of an OLED. In the encapsulation method for an OLED of the present application, by disposing the UV light absorbing layer on the surface of the OLED device, in one aspect, the UV light absorbing layer has a low UV transmittance. Therefore, UV light can be blocked from being directed to the TFT during UV curing of the encapsulation material and the sealant to reduce or eliminate the influence of UV light on the TFT; on the other hand, the UV light absorbing layer has high visible light transmittance and therefore does not reduce the light intensity of the OLED device. The encapsulation structure of the OLED of the present application is fabricated by the (Continued)

above encapsulation method. The TFT has excellent electrical performance and the OLED device thereof has strong light intensity.

5 Claims, 6 Drawing Sheets

(56) References Cited

FOREIGN PATENT DOCUMENTS

| | | |
|---|---|---|
| CN | 106328825 | 1/2017 |
| KR | 100730220 B1 | 6/2007 |
| WO | WO2008133923 | 11/2008 |
| WO | WO2014059601 | 4/2014 |

* cited by examiner

OLED ENCAPSULATING STRUCTURE AND MANUFACTURING METHOD THEREOF

RELATED APPLICATIONS

The present application is a National Phase of International Application Number PCT/CN2017/113695, filed on Nov. 30, 2017, and claims the priority of China Application 201711060227.5, filed on Nov. 1, 2017.

FIELD OF THE DISCLOSURE

The disclosure relates to a display technical field, and more particularly to an encapsulation method for an OLED and an Encapsulation structure of OLED.

BACKGROUND

Organic Light Emitting Diode (OLED) has been widely used in the field of display, lighting and smart wearable for its advantages of good self-luminous characteristics, high contrast, fast response and flexible display and etc.

With the development of science technology, OLED technology has become an important candidate for the third generation of display technology used for consumer electronics such as mobile phones, computers, televisions, etc. The basic display principle of OLED is as follows: driven by an electric field, the organic material emits light by the injection and recombination of carriers. OLED can be independently illuminated by RGB pixels, white OLED combined with color filter or blue OLED with light color conversion to achieve full color display. OLED display technology can make the panel thinner; its self-luminous characteristics can also achieve higher contrast in the wild evening, and can be made on the substrate of different materials, and can be made as a flexible display device.

Green environment and energy-efficient way of life has become the trend of people's lives, so OLED is considered as the future lighting technology. Light-emitting materials of OLED are organic semiconductors; the material properties of the light-emitting layer can be controlled to produce light with different wavelengths. OLED is a planar light source with soft light. Its illumination can achieve thinner, if the OLED is fabricated on a flexible substrate, it can realize a large area and a flexible light source, and has potential applications in home decoration and the like.

Smart wear market will be an important direction for OLED technology development. The thin, flexible and portable properties of flexible AMOLEDs (active matrix organic light-emitting diodes) determine that there will be wider room for application on wearable devices. OLED display panel can be equipped to a bracelet or watch; it can achieve the perfect fit with the wrist, but also can realize making calls, internet and other functions.

In addition, OLED has potential applications in car audio display, smart home, aerospace technology.

The difference between OLED and conventional LCD is that a backlight is no more needed, through the carriers of both electron and hole to inject the organic thin-film organic materials and recombination to emit light in the organic materials. However, the organic materials are very sensitive to moisture and oxygen. The permeation of water/oxygen is greatly reducing the lifetime of the device. To meet the commercialized requirements for the lifetime and stability of OLED device, the OLED devices have very high requirements for encapsulation: the lifetime is at least $10^4$ hours, the transmission rate of water vapor is less than $10^{-6}$ g/m²/day, and the transmission rate of oxygen is less than $10^{-5}$ g/m²/day (1 atm). Therefore, encapsulation in the fabrication of OLED devices is in an important position, is one of the key factors affecting the yield of the product.

The encapsulation methods for existing OLED device mainly include glass encapsulation, that is, the encapsulation glass is coated with a UV light curable sealant, a laser sealing for laser-encapsulation, or a sealant and filing a Dam & Fill desiccant and cured to provide a relatively confined environment for the light-emitting device, to achieve good water/oxygen barrier capability in a certain period of time.

Flexible OLED panel is an important research direction of organic light-emitting devices. In recent two years, the exploration of encapsulation of flexible OLED devices is in full swing. Thin film encapsulation using plasma enhanced chemical vapor deposition, PECVD or atomic layer deposition, ALD has become a research hotspot. However, the encapsulation cost of flexible OLED devices is 1 to 5 times of the cost of conventional cover encapsulation devices. Although the flexible OLED display is the future trends, but the conventional flat glass OLED encapsulation device does not disappear.

TFTs play an important role in active matrix driven display devices, AMOLEDs, typically as switching devices and driving devices in display devices. By the high UV light energy, TFTs generate carriers, electrons or holes under light irradiation, when the free carrier concentration increases, the threshold voltage, Vth decreases, and the Vth shifting directly causes the luminance of the pixel to be changed, thereby affecting the overall display quality. Therefore, the long-term stability of the TFT display device is very important.

The encapsulation for large-size devices need to add filler to improve the mechanical properties of the device, in addition to eliminate Newton ring (especially for top-emitting devices, Newton rings must be eliminated). Currently filler has two major categories according to the method for curing: UV light curing and thermal curing. Wherein, UV light curing process is simple, curing time is short, usually 5 min-15 min, Tact time of mass production can be shortened; its shortcomings are UV light is irradiated to the device from a side of the cover plate, during trigger curing of the filler, it causes TFT electrical shift at the same time, reducing the overall image display quality. A temperature of thermal curing of the Filler currently in the market is about 100° C., curing time up to 60 min-90 min; In addition, the temperature uniformity of the oven adapted has a significant impact on the degree of curing the filler, uneven curing of the filler will result encapsulation mura (phenomenon of uneven brightness of the display device).

FIG. 1 is a schematic diagram of a conventional encapsulation process of OLED, as shown in FIG. 1, an existing encapsulation structure of OLED includes a TFT substrate 100 and an encapsulation cover plate 200 disposed opposite to each other, an OLED device 300 disposed between the TFT substrate 100 and the encapsulation cover plate 200 and disposed on the TFT substrate 100, a sealant 600 disposed between the TFT substrate 100 and the encapsulation cover plate 200 and forming a sealed space 610 between the TFT substrate 100 and the encapsulation cover plate 200, an encapsulation material 700 filled in the sealed space 610.

As shown in FIG. 1, when the encapsulation material 700 is UV light cured from a side of the encapsulation cover plate 200, when the encapsulation material 700 is solidified by the UV light, at the same time, the performance of the TFT device in the TFT substrate 100 is affected, and cause the TFT device in the TFT substrate 100 to electrically shifted, and reduce the overall image display quality.

SUMMARY

An object of the present application is to provide an encapsulation method for an OLED capable of reducing or eliminating the influence of UV light to the TFT during UV light curing of the encapsulation material and the sealant.

The object of the present application is also to provide encapsulation structure of an OLED, obtained by the above method, and the TFT thereof has excellent electrical performance.

In order to achieve the above object, the present application provides an encapsulation method for an OLED, including the following steps:

step S1: providing a TFT substrate, fabricating an OLED device on the TFT substrate; forming a first passivation layer covering an outer surface of the OLED device;

Step S2: forming an UV light absorbing layer covering an outer surface of the first passivation layer, the UV light absorbing layer including an organic resin and inorganic particles having UV light absorbing property dispersed in the organic resin, and the UV light absorbing layer is transparent;

Step S3: providing an encapsulation cover, coating a sealant on a periphery of the encapsulation cover corresponding to the OLED device, and disposing an encapsulation material in a region surrounded by the sealant on the encapsulation cover and Step S4: aligning the encapsulation cover and the TFT substrate, the sealant being adhered to the TFT substrate and the encapsulation cover respectively, and forming a sealed space between the TFT substrate and the encapsulation cover, the encapsulation material filled in the sealed space.

wherein an UV light transmittance of the UV light absorption layer is less than 5%, and a transmittance of the visible light is more than 80%, the UV light absorbing layer has a thickness of 1 µm to 10 µm, a content of the inorganic particles in the UV light absorbing layer is 0.1 vol % to 1.0 vol %, and the inorganic particles have a particle size of 1 nm to 150 nm.

wherein the organic resin includes one or more of polyurethane, acrylic resin and epoxy resin, the inorganic particles includes one or more of metal oxide particles and metal oxide modified particles, the metal oxide particles includes one or more of titanium oxide particles, zinc oxide particles, and cerium oxide particles, and the metal oxide modified particles includes one or more of titanium oxide modified particles, zinc oxide modified particles, and cerium oxide modified particles.

wherein the method for forming the UV light absorbing layer includes dispersing the inorganic particles in a solution of an organic resin precursor to prepare a UV light absorbing solution, forming a film of the UV light absorbing layer on the outer surface of the first passivation layer by the UV light absorbing solution by adapting a solution film casting process, curing to form the UV light absorbing layer, the solution film casting process includes one or more of spin coating, one drop filling, ink jet printing, tape casting, and nozzle printing.

wherein the step S2 further includes: forming a second passivation layer covering the UV light absorption layer on the outer surface of the UV light absorption layer.

The present application further includes an encapsulation structure of an OLED, including:

a TFT substrate and a encapsulation cover disposed opposite to each other, an OLED device disposed between the TFT substrate and the encapsulation cover, and the OLED device disposed on the TFT substrate, a first passivation layer disposed on an outer surface of the OLED device and covering the OLED device, an UV light absorption layer disposed on an outer surface of the first passivation layer and covering the first passivation layer, a sealant disposed between the TFT substrate and the encapsulation cover and enclosing a sealed space between the TFT substrate and the encapsulation cover, and an encapsulation material filled in the sealed space 61; and wherein the sealant is disposed on a periphery of the OLED device, the UV light absorbing layer includes an organic resin and inorganic particles having UV light absorbing property dispersed in the organic resin, and the UV light absorbing layer is transparent.

wherein an UV light transmittance of the UV light absorption layer is less than 5%, and a transmittance of the visible light is more than 80%, the UV light absorbing layer has a thickness of 1 µm to 10 µm, a content of the inorganic particles in the UV light absorbing layer is 0.1 vol % to 1.0 vol %, and the inorganic particles have a particle size of 1 nm to 150 nm.

wherein the organic resin includes one or more of polyurethane, acrylic resin and epoxy resin, the inorganic particles includes one or more of metal oxide particles and metal oxide modified particles, the metal oxide particles includes one or more of titanium oxide particles, zinc oxide particles, and cerium oxide particles, and the metal oxide modified particles includes one or more of titanium oxide modified particles, zinc oxide modified particles, and cerium oxide modified particles.

wherein further includes a second passivation layer formed and covered the UV light absorption layer on the outer surface of the UV light absorption layer.

wherein both materials of the first passivation layer and the second passivation layer includes silicon nitride, both thickness of the first passivation layer and the second passivation layer is 500 nm-800 nm, and a material of the encapsulation material includes one or more of polyurethane, acrylic resin and epoxy resin.

The present application further includes an encapsulation method for an OLED, including the following steps:

step S1: providing a TFT substrate, fabricating an OLED device on the TFT substrate; forming a first passivation layer covering an outer surface of the OLED device;

Step S2: forming an UV light absorbing layer covering an outer surface of the first passivation layer, the UV light absorbing layer including an organic resin and inorganic particles having UV light absorbing property dispersed in the organic resin, and the UV light absorbing layer is transparent;

Step S3: providing an encapsulation cover, coating a sealant on a periphery of the encapsulation cover corresponding to the OLED device, and disposing an encapsulation material in a region surrounded by the sealant on the encapsulation cover;

Step S4: aligning the encapsulation cover and the TFT substrate, the sealant being adhered to the TFT substrate and the encapsulation cover respectively, and forming a sealed space between the TFT substrate and the encapsulation cover, the encapsulation material filled in the sealed space;

wherein an UV light transmittance of the UV light absorption layer is less than 5%, and a transmittance of the visible light is more than 80%, the UV light absorbing layer has a thickness of 1 µm to 10 µm, a content of the inorganic particles in the UV light absorbing layer is 0.1 vol % to 1.0 vol %, and the inorganic particles have a particle size of 1 nm to 150 nm;

wherein the organic resin includes one or more of polyurethane, acrylic resin and epoxy resin, the inorganic particles includes one or more of metal oxide particles and metal oxide modified particles, the metal oxide particles includes one or more of titanium oxide particles, zinc oxide particles, and cerium oxide particles, and the metal oxide modified particles includes one or more of titanium oxide modified particles, zinc oxide modified particles, and cerium oxide modified particles;

wherein the method for forming the UV light absorbing layer includes dispersing the inorganic particles in a solution of an organic resin precursor to prepare a UV light absorbing solution, forming a film of the UV light absorbing layer on the outer surface of the first passivation layer by the UV light absorbing solution by adapting a solution film casting process, curing to form the UV light absorbing layer, the solution film casting process includes one or more of spin coating, one drop filling, ink jet printing, tape casting, and nozzle printing; and wherein the step S2 further includes: forming a second passivation layer covering the UV light absorption layer on the outer surface of the UV light absorption layer.

The beneficial effects of the present application are as follows: in the encapsulation method for an OLED of the present application, by disposing the UV light absorbing layer on the surface of the OLED device, in one aspect, the UV light absorbing layer has a low UV transmittance. Therefore, UV light can be blocked from being directed to the TFT during UV curing of the encapsulation material and the sealant to reduce or eliminate the influence of UV light on the TFT; on the other hand, the UV light absorbing layer has high visible light transmittance and therefore does not reduce the light intensity of the OLED device. The encapsulation structure of the OLED of the present application is fabricated by the above encapsulation method. The TFT has excellent electrical performance and the OLED device thereof has strong light intensity.

For further understanding of the features and technical contents of the present application, reference should be made to the following detailed description and accompanying drawings of the present application. However, the drawings are for reference only and are not intended to limit the present application.

BRIEF DESCRIPTION OF THE DRAWINGS

The technical solutions of the present application and other beneficial effects will be apparent from the following detailed description of specific embodiments of the present application with reference to the accompanying drawings.

In the drawings.

DETAILED DESCRIPTION OF PREFERRED EMBODIMENTS

To further illustrate the technical means adopted by the present application and the effects thereof, the following describes the preferred embodiments of the present application and the accompanying drawings in detail.

Figure 1:
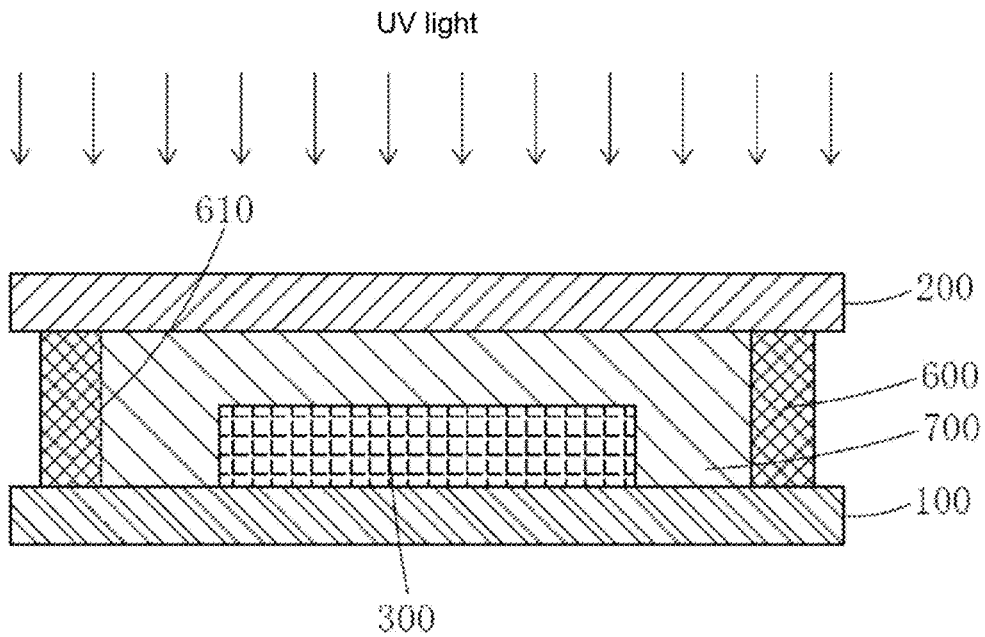
FIG. 1 is a schematic diagram of a conventional encapsulation process of OLED.
Figure 2:
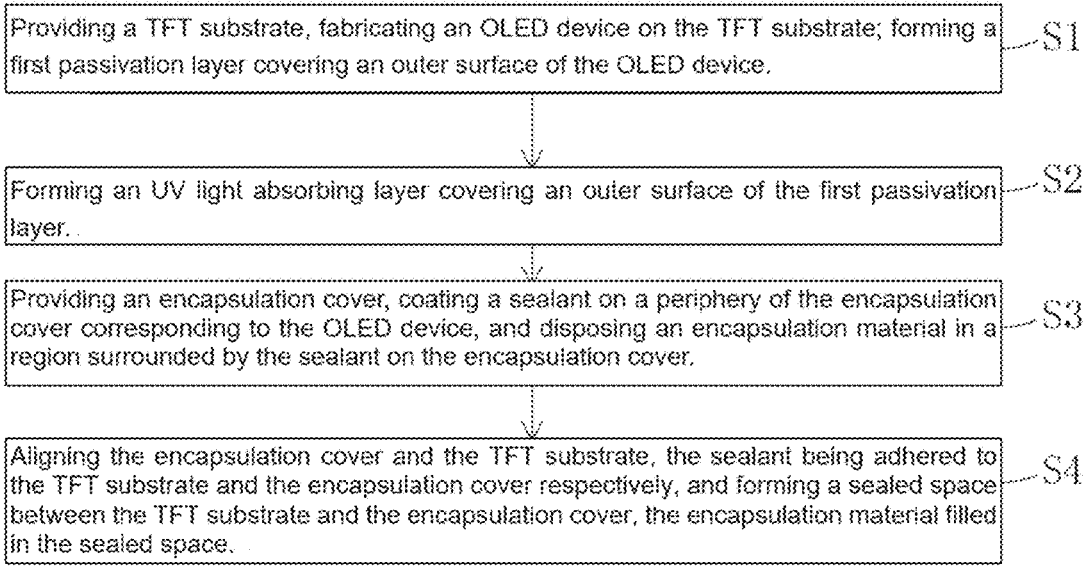
FIG. 2 is a flow chart of the encapsulation method for the OLED of the present application.
Figure 3:
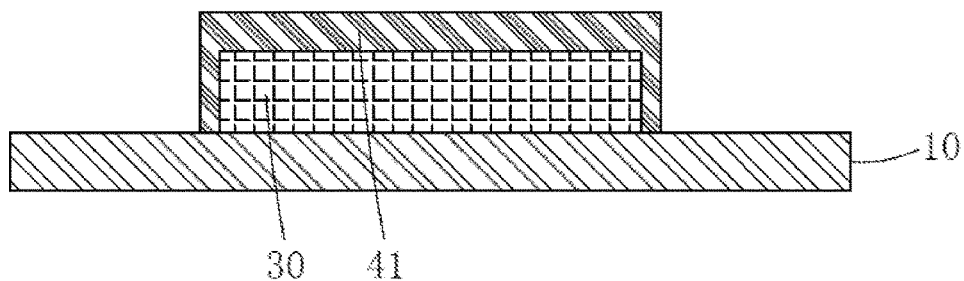
FIG. 3 is a schematic view of step S1 of the encapsulation method for the OLED of the present application.

Referring to FIG. 2, the present application provides an encapsulation method for the OLED including the following steps:

Step S1, as shown in FIG. 3, providing a TFT substrate 10, fabricating an OLED device 30 on the TFT substrate 10; forming a first passivation layer 41 covering the OLED device 30 on an outer surface of the OLED device 30.

Figure 4:
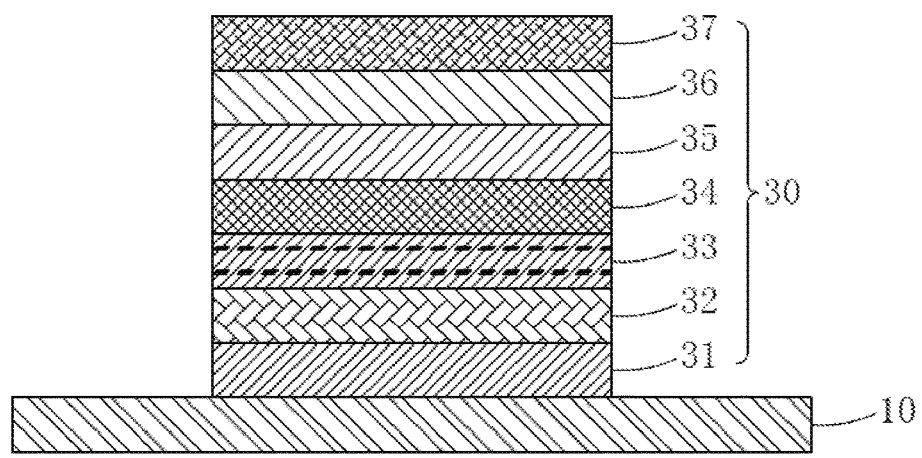
FIG. 4 is a schematic diagram of the specific structure of the OLED device in FIG. 3.

Specifically, as shown in FIG. 4, the OLED device 30 includes an anode 31, a hole injection layer 32, a hole transport layer 33, a light-emitting layer 34, and an electron transport layer 35, an electron injection layer 36, and a cathode 37 sequentially arranged from bottom to top on the TFT substrate 10.

Specifically, the anode 31, the hole injection layer 32, the hole transport layer 33, the light-emitting layer 34, the electron transport layer 35, the electron injection layer 36 and the cathode 37 are all fabricated by the vapor deposition method.

Specifically, the material of the first passivation layer 41 includes silicon nitride, the thickness of the first passivation layer 41 is 500 nm-800 nm, and the first passivation layer 41 is fabricated by a plasma enhanced chemical vapor deposition method, PECVD.

Preferably, the process conditions for fabricating the first passivation layer 41 by the plasma enhanced chemical vapor deposition method are as follows: the reaction gas is monosilane ($SiH_4$) with a purity of more than 99.99% and ammonia ($NH_3$) with a purity of more than 99.99%, the auxiliary ionization gas is argon (Ar) with a purity of more than 99.99%, the power of the RF power is 10 W-500 W, the pressure of the deposition chamber is 10 Pa-20 Pa, and the deposition rate is 3 nm/s-20 nm/s.

Figure 5:
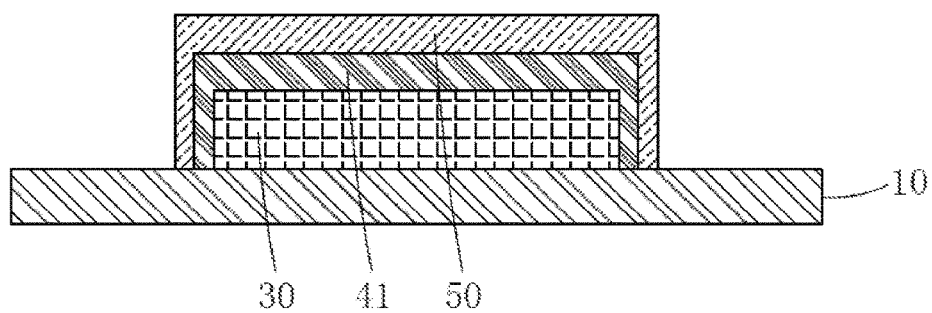
FIG. 5 is a schematic diagram of a first embodiment of step S2 of the encapsulation method for the OLED of the present application.

In step S2, as shown in FIG. 5, an UV light absorbing layer 50 covering the first passivation layer 41 is fabricated on the outer surface of the first passivation layer 41. The UV light absorbing layer 50 includes an organic resin and inorganic particles having UV light absorbing property dispersed in the organic resin, and the UV light absorbing layer 50 is transparent.

Specifically, an UV light transmittance of the UV light absorption layer 50 is less than 5%, and a transmittance of the visible light is more than 80%.

Specifically, the UV light absorbing layer 50 has a thickness of 1 μm to 10 μm.

Specifically, the content of the inorganic particles in the UV light absorbing layer 50 is 0.1 vol % to 1.0 vol %.

Specifically, the major material of the UV light absorbing layer 50 is the organic resin, the organic resin can be selected from one or more than one of organic resins having high visible light transmittance and good transparency, such as polyurethane, acrylic resin and epoxy resin. Preferably, the acrylic resin is acrylic resin (that is polymethylmethacrylate).

Specifically, the inorganic particles can be selected from one or more than one of inorganic particles having low UV light transmittance and high visible light transmittance, such as metal oxide particles and metal oxide modified particles, and the metal oxide particles includes one or more of titanium oxide ($TiO_2$) particles, zinc oxide (ZnO) particles, and cerium oxide ($CeO_2$) particles, the metal oxide modified particles includes one or more of titanium oxide modified particles, zinc oxide modified particles, and cerium oxide modified particles.

Specifically, the metal oxide modified particles refer to particles of a metal oxide modified material obtained by doping with other chemical substances in the metal oxide material. By doping the other chemical elements, the UV light absorption performance of the metal oxide modified material is improved, greater than the UV light absorption performance of the original metal oxide material.

Preferably, the zinc oxide modified particles are aluminum-doped zinc oxide (Al—ZnO) particles.

Specifically, the inorganic particles have a particle size of 1 nm to 150 nm. Preferably, the inorganic particles have a particle size of 20 nm to 50 nm.

Specifically, the method for fabricating the UV light absorbing layer 50 is by dispersing the inorganic particles in a solution of an organic resin precursor to prepare a UV light absorbing solution, the UV light absorbing solution is formed on the outer surface of the first passivation layer 41 by a solution film casting process to obtain the UV light absorbing layer 50 after being cured. The UV light absorbing solution is formed on the outer surface of the first passivation layer 41 by a solution film casting process to obtain the UV light absorbing layer 50 after being cured.

Specifically, the solution film casting process includes one or more of the following methods: spin coating, one drop filling, ODF, ink jet printing, IJP, tape casting, and nozzle printing.

Preferably, in the method for fabricating the UV light absorbing layer 50, the inorganic particles are zinc oxide (ZnO) particles, the zinc oxide particles have a particle size of 20 nm-50 nm, the zinc oxide particles in the UV light absorption solution, the content of the zinc oxide particles in the UV light absorbing solution is from 0.1% to 1.0% by volume, the organic resin precursor solution is the methyl methacrylate monomer solution, and the UV light absorbing solution also contains an initiator that is uniformly dispersed therein, the solution film casting process is ink jet printing, IJP, and the thickness of the uncured film formed on the outer surface of the first passivation layer 41 is 1.0 μm-5.0 μm.

Figure 6:
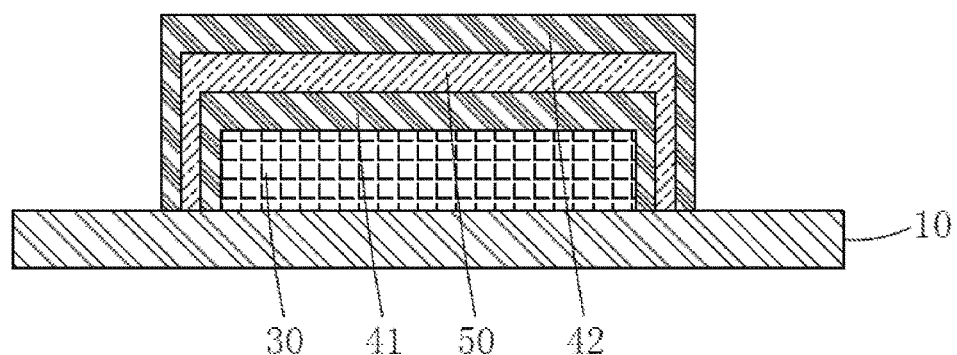
FIG. 6 is a schematic diagram of a second embodiment of the step S2 of the encapsulation method for the OLED of the present application.

Specifically, as shown in FIG. 6, the step S2 may further include: forming a second passivation layer 42 covering the UV light absorption layer 50 on the outer surface of the UV light absorption layer 50.

Specifically, the material of the second passivation layer 42 includes silicon nitride, the second passivation layer 42 has a thickness of 500 nm-800 nm, and the second passi-vation layer 42 is fabricated by using the plasma enhanced chemical vapor deposition method, PECVD.

Preferably, the process conditions for fabricating the second passivation layer 42 by the plasma enhanced chemical vapor deposition method are as follows: the reaction gas is monosilane ($SiH_4$) with a purity of more than 99.99% and ammonia ($NH_3$) with a purity of more than 99.99% The auxiliary ionization gas is argon (Ar) with a purity of more than 99.99%, the power of the RF power is 10 W-500 W, the pressure of the deposition chamber is 10 Pa-20 Pa, and the deposition rate is 3 nm/s-20 nm/s.

Figure 7:
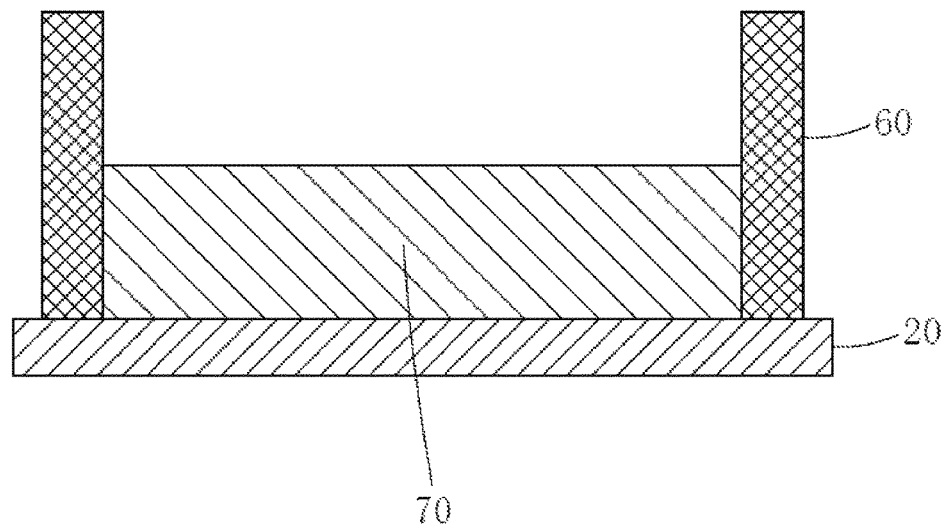
FIG. 7 is a schematic view of step S3 of the encapsulation method for the OLED of the present application.

In step S3, as shown in FIG. 7, providing an encapsulation cover 20, coating a sealant 60 on a periphery of the encapsulation cover 20 corresponding to the OLED device 30, and disposing an encapsulation material 70 in a region surrounded by the sealant 60 on the encapsulation cover 20.

Specifically, the encapsulation material 70 is an uncured liquid material (corresponding to a UV curing Dam & Fill encapsulation process) or a cured film (corresponding to a UV curing face sealant & film encapsulation process).

In step S3, when the encapsulation material 70 is an uncured liquid material, the encapsulation material 70 is coated or printed on the encapsulation plate 20. When the encapsulation material 70 is a cured film, the encapsulation material 70 is attached to the encapsulation cover 20.

Specifically, the encapsulation material 70 includes one or more of organic resins having high visible light transmittance and good transparency, such as polyurethane, acrylic resin and epoxy resin. Preferably, the acrylic resin is acrylic resin (that is polymethylmethacrylate).

Preferably, the encapsulation material 70 is the same material as the organic resin in the UV light absorbing layer 50.

Specifically, the encapsulation material 70 can improve the mechanical performance of the Encapsulation structure of OLED prepared subsequently, and in addition, can eliminate the Newton ring and improve the display performance.

Figure 8:
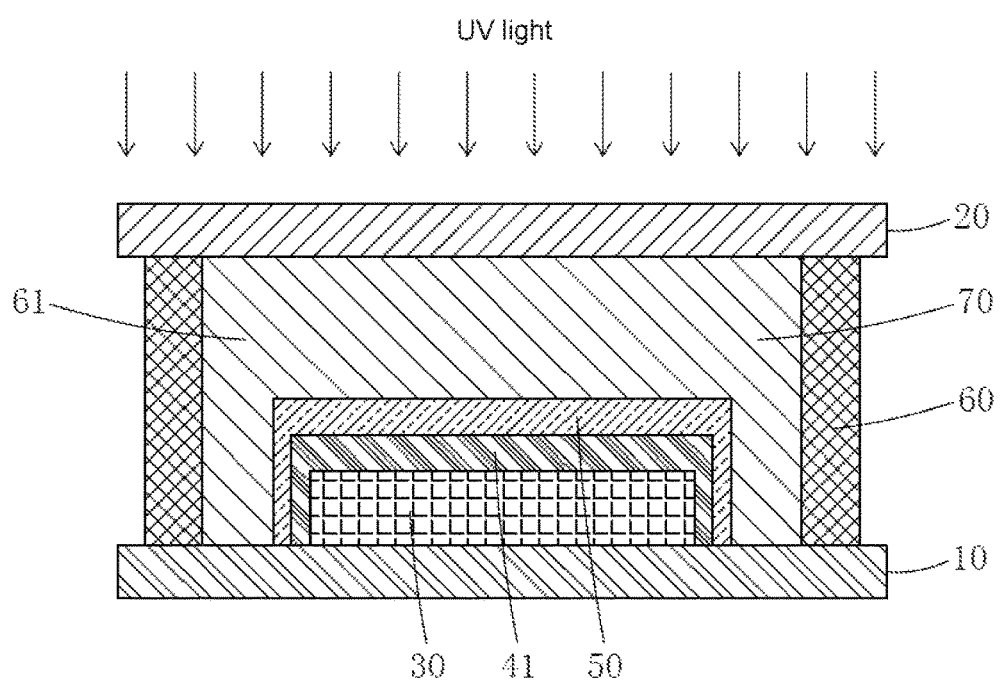
FIG. 8 is a schematic view of a first embodiment of step S4 of the encapsulation method for the OLED of the present application.
Figure 9:
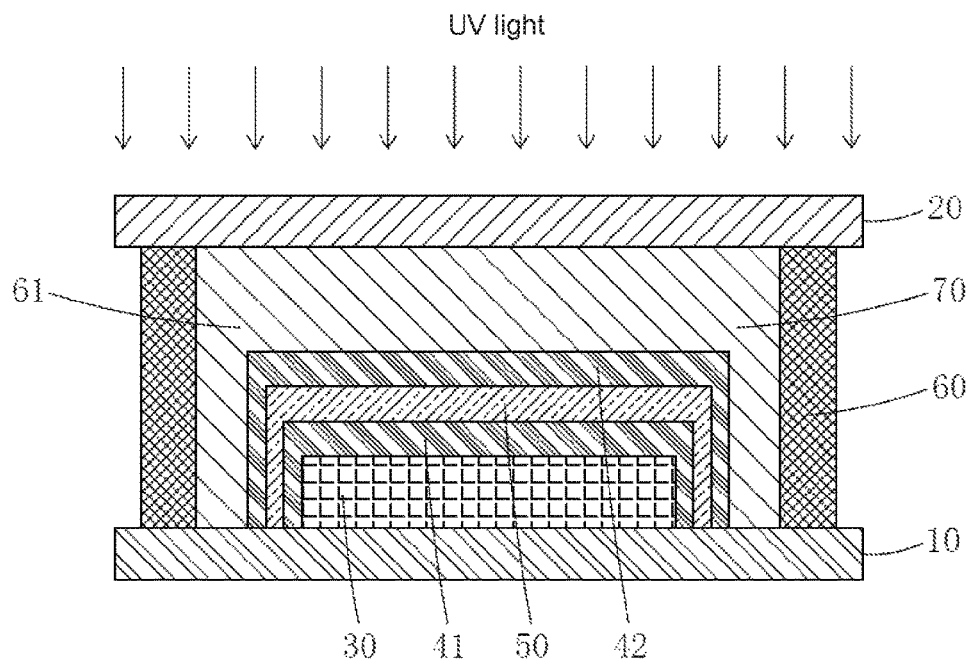
FIG. 9 is a schematic view of a second embodiment of step S4 of the encapsulation method for the OLED of the present application.

In step S4, as shown in FIG. 8 and FIG. 9, aligning the encapsulation cover 20 and the TFT substrate 10, the sealant 60 is adhered to the TFT substrate 10 and the encapsulation cover 20 respectively, and forming the sealed space 61 between the TFT substrate 10 and the encapsulation cover 20, the encapsulation material 70 is filled in the sealed space 61.

Specifically, when the encapsulation material 70 in step S3 is the cured film, the step S4 further includes a step of curing the sealant 60 by UV light.

Specifically, as shown in FIG. 8 and FIG. 9, when the encapsulation material 70 in the step S3 is an uncured liquid material, the step S4 further includes a step of simultaneously performing UV light curing on the encapsulation material 70 and the sealant 60. Preferably, the UV light curing is simultaneously performed on the encapsulation material 70 and the sealant 60 by irradiating the encapsulation material 70 and the sealant 60 with UV light from the side of the encapsulating cover 20 for curing. The UV light has a wavelength of 365 nm and the UV light has an intensity of 5000 $MJ/cm^2$ to 9000 $MJ/cm^2$.

In the encapsulation method for the OLED of the present application, the UV light absorbing layer 50 is disposed on the surface of the OLED device 30, in one aspect, the UV light absorbing layer 50 has a low UV transmittance. Therefore, UV light can be blocked from being directed to the TFT during UV curing of the encapsulation material 70 and the sealant 60 to reduce or eliminate the influence of UV light on the TFT; on the other hand, the UV light absorbing layer 50 has high visible light transmittance and therefore does not reduce the light intensity of the OLED device 30.

Figure 10:
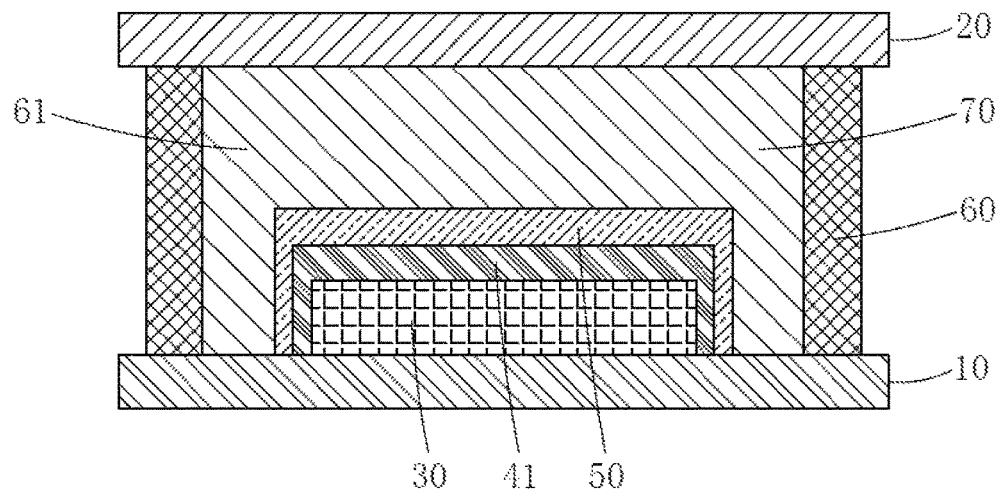
FIG. 10 is a schematic cross-sectional view of a first embodiment of the encapsulation structure of the OLED of the present application.
Figure 11:
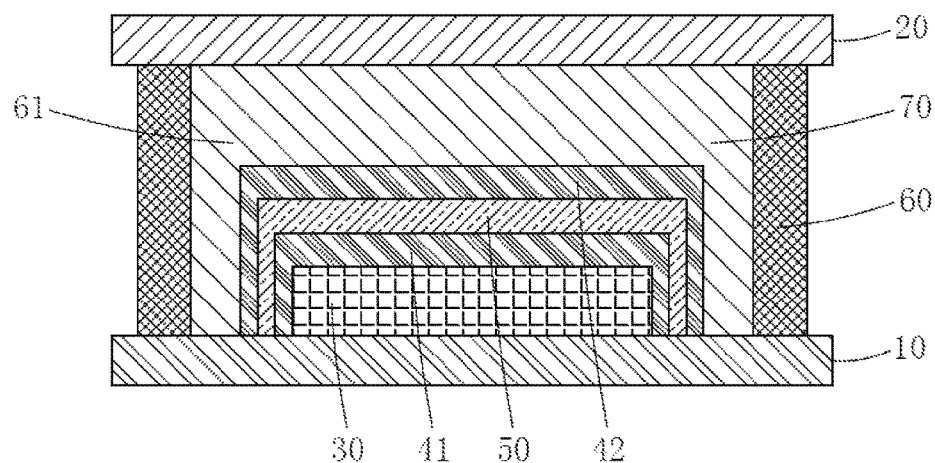
FIG. 11 is a schematic cross-sectional view of a first embodiment of the encapsulation structure of the OLED of the present application.

Referring to FIG. 10 and FIG. 11, and also referring to FIG. 4, based on the above encapsulation method for the OLED, the present application provides an encapsulation structure of OLED including: a TFT substrate 10 and a encapsulation cover 20 disposed opposite to each other, an OLED device 30 disposed between the TFT substrate 10 and the encapsulation cover, and the OLED device 30 disposed on the TFT substrate 10, the first passivation layer 41 provided on the outer surface of the OLED device 30 and covering the OLED device 30, the UV light absorption layer 50 provided on the outer surface of the first passivation layer 41 and covering the first passivation layer 41, the sealant 60 provided between the TFT substrate 10 and the encapsulation cover 20 and enclosing the sealed space 61 between the TFT substrate 10 and the encapsulation cover 20, and the encapsulation material 70 filled in the sealed space 61.

Wherein, the sealant 60 is disposed on the periphery of the OLED device 30. The UV light absorbing layer 50 includes organic resin and inorganic particles dispersed in the organic resin and having UV light absorbing property. The UV light absorbing layer 50 is transparent.

Specifically, as shown in FIG. 4, the OLED device 30 includes the anode 31, the hole injection layer 32, the hole transport layer 33, the light-emitting layer 34, and the electron transport layer 35, the electron injection layer 36, and the cathode 37 sequentially arranged from bottom to top on the TFT substrate 10.

Specifically, the material of the first passivation layer 41 includes silicon nitride, and the thickness of the first passivation layer 41 is 500 nm-800 nm.

Specifically, the UV light absorption layer 50 has an UV light transmittance of less than 5% and a visible light transmittance of more than 80%.

Specifically, the UV LIGHT absorbing layer 50 has a thickness of 1 μm to 10 μm.

Specifically, the content of the inorganic particles in the UV light absorbing layer 50 is 0.1 vol % to 1.0 vol %.

Specifically, the major material of the UV light absorbing layer 50 is the organic resin, the organic resin can be selected from one or more than one of organic resins having high visible light transmittance and good transparency, such as polyurethane, acrylic resin and epoxy resin. Preferably, the acrylic resin is acrylic resin (that is polymethylmethacrylate).

Specifically, the inorganic particles can be selected from one or more than one of inorganic particles having low UV light transmittance and high visible light transmittance, such as metal oxide particles and metal oxide modified particles, and the metal oxide particles includes one or more of titanium oxide ($TiO_2$) particles, zinc oxide (ZnO) particles, and cerium oxide ($CeO_2$) particles, the metal oxide modified particles includes one or more of titanium oxide modified particles, zinc oxide modified particles, and cerium oxide modified particles.

Specifically, the metal oxide modified particles refer to particles of a metal oxide modified material obtained by doping with other chemical substances in the metal oxide material. By doping the other chemical elements, the UV light absorption performance of the metal oxide modified material is improved, greater than the UV light absorption performance of the original metal oxide material.

Preferably, the zinc oxide modified particles are aluminum-doped zinc oxide (Al—ZnO) particles.

Specifically, the inorganic particles have a particle size of 1 nm to 150 nm. Preferably, the inorganic particles have a particle size of 20 nm to 50 nm.

Specifically, as shown in FIG. 11, the encapsulation structure of OLED may further include a second passivation layer 42 disposed on the outer surface of the UV light absorbing layer 50 and covering the UV light absorbing layer 50.

Specifically, the material of the second passivation layer 42 includes silicon nitride, and the thickness of the second passivation layer 42 is 500 nm-800 nm.

Specifically, the encapsulation material 70 includes one or more of organic resins having high visible light transmittance and good transparency, such as polyurethane, acrylic resin and epoxy resin. Preferably, the acrylic resin is acrylic resin (that is polymethylmethacrylate).

Preferably, the encapsulation material 70 is the same material as the organic resin in the UV light absorbing layer 50.

In the encapsulation structure of the OLED of the present application, the UV light absorbing layer 50 is disposed on the surface of the OLED device 30, in one aspect, the UV light absorbing layer 50 has a low UV transmittance. Therefore, UV light can be blocked from being directed to the TFT during UV curing of the encapsulation material 70 and the sealant 60 to reduce or eliminate the influence of UV light on the TFT; on the other hand, the UV light absorbing layer 50 has high visible light transmittance and therefore does not reduce the light intensity of the OLED device 30.

To sum up, the present application provides an encapsulation method for OLED and an encapsulation structure of OLED. In the encapsulation method for OLED of the present application, by disposing the UV light absorbing layer on the surface of the OLED device, in one aspect, the UV light absorbing layer has a low UV transmittance. Therefore, UV light can be blocked from being directed to the TFT during UV curing of the encapsulation material and the sealant to reduce or eliminate the influence of UV light on the TFT; on the other hand, the UV light absorbing layer has high visible light transmittance and therefore does not reduce the light intensity of the OLED device. The encapsulation structure of the OLED of the present application is fabricated by the above encapsulation method. The TFT has excellent electrical performance and the OLED device thereof has strong light intensity.

The foregoing contents are detailed description of the disclosure in conjunction with specific preferred embodiments and concrete embodiments of the disclosure are not limited to these descriptions. For the person skilled in the art of the disclosure, without departing from the concept of the disclosure, simple deductions or substitutions can be made and should be included in the protection scope of the application.

What is claimed is:

1. An encapsulation method for an OLED, comprising the following steps:
   step S1: providing a TFT substrate, fabricating an OLED device on the TFT substrate; forming a first passivation layer covering an outer surface of the OLED device;
   step S2: forming an UV light absorbing layer covering an outer surface of the first passivation layer, the UV light absorbing layer comprising an organic resin and inorganic particles having UV light absorbing property dispersed in the organic resin, and the UV light absorbing layer is transparent;
   step S3: providing an encapsulation cover, coating a sealant on a periphery of the encapsulation cover corresponding to the OLED device, and disposing an encapsulation material in a region surrounded by the sealant on the encapsulation cover;

step S4: aligning the encapsulation cover and the TFT substrate, the sealant being adhered to the TFT substrate and the encapsulation cover respectively, and forming a sealed space between the TFT substrate and the encapsulation cover, the encapsulation material filled in the sealed space;

wherein the step S2 further comprises: forming a second passivation layer covering the UV light absorption layer on the outer surface of the UV light absorption layer; and wherein the first passivation layer and the second passivation layer comprise silicon nitride.

2. The encapsulation method for the OLED according to claim 1, wherein an UV light transmittance of the UV light absorption layer is less than 5%, and a transmittance of the visible light is more than 80%, the UV light absorbing layer has a thickness of 1 μm to 10 μm, a content of the inorganic particles in the UV light absorbing layer is 0.1 vol % to 1.0 vol %, the inorganic particles have a particle size of 1 nm to 150 nm.

3. The encapsulation method for the OLED according to claim 1, wherein the organic resin comprises one or more of polyurethane, acrylic resin and epoxy resin, the inorganic particles comprise one or more of metal oxide particles and metal oxide modified particles, the metal oxide particles comprise one or more of titanium oxide particles, zinc oxide particles, and cerium oxide particles, and the metal oxide modified particles comprises one or more of titanium oxide modified particles, zinc oxide modified particles, and cerium oxide modified particles.

4. The encapsulation method for the OLED according to claim 1, wherein the method for forming the UV light absorbing layer comprises dispersing the inorganic particles in a solution of an organic resin precursor to prepare a UV light absorbing solution, forming a film of the UV light absorbing layer on the outer surface of the first passivation layer by the UV light absorbing solution by adapting a solution film casting process, curing to form the UV light absorbing layer, the solution film casting process comprises one or more of spin coating, one drop filling, ink jet printing, tape casting, and nozzle printing.

5. An encapsulation method for an OLED, comprising the following steps:
   step S1: providing a TFT substrate, fabricating an OLED device on the TFT substrate; forming a first passivation layer covering an outer surface of the OLED device;
   step S2: forming an UV light absorbing layer covering an outer surface of the first passivation layer, the UV light absorbing layer comprising an organic resin and inorganic particles having UV light absorbing property dispersed in the organic resin, and the UV light absorbing layer is transparent;
   step S3: providing an encapsulation cover, coating a sealant on a periphery of the encapsulation cover corresponding to the OLED device, and disposing an encapsulation material in a region surrounded by the sealant on the encapsulation cover;
   step S4: aligning the encapsulation cover and the TFT substrate, the sealant being adhered to the TFT substrate and the encapsulation cover respectively, and forming a sealed space between the TFT substrate and the encapsulation cover, the encapsulation material filled in the sealed space;

wherein an UV light transmittance of the UV light absorption layer is less than 5%, and a transmittance of the visible light is more than 80%, the UV light absorbing layer has a thickness of 1 μm to 10 μm, a content of the inorganic particles in the UV light absorbing layer is 0.1 vol % to 1.0 vol %, and the inorganic particles have a particle size of 1 nm to 150 nm;

wherein the organic resin comprises one or more of polyurethane, acrylic resin and epoxy resin, the inorganic particles comprises one or more of metal oxide particles and metal oxide modified particles, the metal oxide particles comprises one or more of titanium oxide particles, zinc oxide particles, and cerium oxide particles, and the metal oxide modified particles comprises one or more of titanium oxide modified particles, zinc oxide modified particles, and cerium oxide modified particles;

wherein the method for forming the UV light absorbing layer comprises dispersing the inorganic particles in a solution of an organic resin precursor to prepare a UV light absorbing solution, forming a film of the UV light absorbing layer on the outer surface of the first passivation layer by the UV light absorbing solution by adapting a solution film casting process, curing to form the UV light absorbing layer, the solution film casting process comprises one or more of spin coating, one drop filling, ink jet printing, tape casting, and nozzle printing;

wherein the step S2 further comprises: forming a second passivation layer covering the UV light absorption layer on the outer surface of the UV light absorption layer; and wherein the first passivation layer and the second passivation layer comprise silicon nitride.

* * * * *